US007565124B2

(12) United States Patent
Lee et al.

(10) Patent No.: US 7,565,124 B2
(45) Date of Patent: Jul. 21, 2009

(54) AUTOMATIC GAIN CONTROL CIRCUIT INCLUDING POWER DETECTOR

(75) Inventors: Junghwan Lee, Yongin-si (KR); Bonkee Kim, Seongnam-si (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 418 days.

(21) Appl. No.: 11/178,474

(22) Filed: Jul. 12, 2005

(65) Prior Publication Data

US 2006/0135104 A1 Jun. 22, 2006

(30) Foreign Application Priority Data

Dec. 17, 2004 (KR) .................... 10-2004-0107576

(51) Int. Cl.
*H04B 1/06* (2006.01)
*H04B 17/00* (2006.01)
(52) U.S. Cl. .................. 455/234.1; 455/226.2; 375/345
(58) Field of Classification Search ................ 455/67.1, 455/226.1, 226.2, 232.1, 234.1, 245.1, 250.1, 455/67.11; 375/345
See application file for complete search history.

(56) References Cited

U.S. PATENT DOCUMENTS 5,884,152 A * 3/1999 Matsumoto .............. 455/234.1
5,999,578 A * 12/1999 Ha ........................... 375/345
6,741,844 B2 * 5/2004 Medvid et al. ............ 455/232.1
6,993,291 B2 * 1/2006 Parssinen et al. ......... 455/67.11
7,113,758 B2 * 9/2006 Kishi ....................... 455/234.1
7,155,230 B2 * 12/2006 Tsien ....................... 455/226.2

* cited by examiner

*Primary Examiner*—Quochien B Vuong
(74) *Attorney, Agent, or Firm*—Foley & Lardner LLP

(57) ABSTRACT

Disclosed herein is an automatic gain control circuit including a power detector. The automatic gain control circuit includes a receiving unit for receiving an RF signal and a gain control unit for controlling the gain of the receiving unit. The receiving unit comprises an amplification part including a low noise amplifier and a gain amplifier for amplifying the RF signal, a mixer for down-converting and tuning the RF signal output from the gain amplifier, a low pass filter for receiving the down-converted signal from the mixer, and an intermediate frequency variable gain amplifier for amplifying the signal filtered by the low pass filter to an intermediate frequency signal. The gain control unit comprises a received signal strength indicator connected to the output port of the low pass filter to detect the level of the output signal of the low pass filter, a first comparator for comparing the output signal level detected by the received signal strength indicator with a reference signal level, a power detector for detecting the output signal level of the amplification part of the receiving unit, a second comparator for comparing the output signal level detected by the power detector with a reference signal level, and a gain controller for increasing, decreasing or holding the gain in response to the signals output from the first and second comparators.

8 Claims, 6 Drawing Sheets

AUTOMATIC GAIN CONTROL CIRCUIT INCLUDING POWER DETECTOR

BACKGROUND OF THE INVENTION

1. Field of the Invention

The present invention relates to an automatic gain control circuit, and more particularly, to an automatic gain control circuit including a power detector.

2. Background of the Related Art

FIG. 1 is a block diagram of a conventional automatic gain control circuit 100 including an RF received signal strength indicator (RF RSSI). Referring to FIG. 1, the automatic gain control circuit 100 includes a receiving unit 110 and a gain control unit 120.

The receiving unit 110 includes a low noise amplifier (LNA) 111, a variable gain amplifier (VGA) 112, an image-rejection mixer (IRM) 113, a low pass filter (LPF) 114, and an intermediate frequency variable gain amplifier (IF VGA) 115. The gain control unit 120 includes a gain controller 121, an RF received signal strength indicator (RF RSSI) 122, and a comparator 123.

The LNA 111 of the receiving unit 110 amplifies a received signal while maximally restraining amplification of a noise of the received signal. The VGA 112 of the receiving unit 110 amplifies the signal amplified by the LNA 111 to a signal with improved linearity within a predetermined range.

The signal amplified by the VGA 112 passes through the IRM 113 having an image rejection down-conversion function such that an image frequency is rejected to remove parasitic frequencies. That is, the IRM 113 of the receiving unit 113 separates an RF stage from an IF stage to secure stability of the receiving unit 110.

The LPF 114 of the receiving unit 110 is constructed such that it filters only a specific low band. The signal filtered by the LPF 114 is amplified by the IF VGA 115. Here, a weak received signal cannot be sufficiently amplified only with the LNA 111 of the receiving unit 110. Thus, the weak received signal is gain-controlled and amplified using the IF VGA 115 for accurate power control.

When the received signal passes through all the components of the receiving unit 110, it is amplified with its image frequency rejected and output as an intermediate frequency.

The gain controller 121 of the gain control unit 120 outputs control signals for respectively controlling the gains of the LNA 111, VGA 112 and IRM 113. The RF RSSI 122 of the gain control unit 120 measures the strength of the signal output from the LPF 114 of the receiving unit 110. The comparator 123 of the gain control unit 120 sends a gain compensation value based on the signal strength measured by the RF RSSI 122 to the gain controller 121.

Consequently, in the RF automatic gain control (AGC) loop, input signal power is detected from the output signal of the low pass filter. Thus, only the power of a desired channel is detected to control the gain of the gain stage of the RF AGC loop. Here, the RF AGC loop is constructed of the LNA 111, VGA 112, IRM 113, LPF 114, RF RSSI 122, comparator 123 and gain controller 121.

When a weak signal is input to the desired channel and a strong noise signal is input to an undesired channel, the gain stage of the RF automatic gain control loop becomes smaller than a predetermined gain. Here, though the RF AGC loop attempts to increase the gain, the strength of disturbance signal is increased to further reduce the gain. As a result, the RF automatic gain control loop cannot be normally operated.

SUMMARY OF THE INVENTION

Accordingly, the present invention has been made to solve the above-mentioned problems occurring in the prior art, and an object of the present invention is to provide a circuit for preventing an RF AGC loop from being erroneously operated due to an undesirable large signal among received signals.

Another object of the present invention is to provide a circuit for reducing the gain of the RF AGC loop to receive a desired channel signal even when a signal larger than the desired signal is input to a neighboring channel.

To accomplish the above objects, according to the present invention, there is provided an automatic gain control circuit including a receiving unit for receiving an RF signal and a gain control unit for controlling the gain of the receiving unit. The receiving unit comprises an amplification part including a low noise amplifier and a gain amplifier for amplifying the RF signal, a mixer for down-converting and tuning the RF signal output from the gain amplifier, a low pass filter for receiving the down-converted signal from the mixer, and an intermediate frequency variable gain amplifier for amplifying the signal filtered by the low pass filter to an intermediate frequency signal. The gain control unit comprises a received signal strength indicator connected to the output port of the low pass filter to detect the level of the output signal of the low pass filter, a first comparator for comparing the output signal level detected by the received signal strength indicator with a reference signal level, a power detector for detecting the output signal level of the amplification part of the receiving unit, a second comparator for comparing the output signal level detected by the power detector with a reference signal level, and a gain controller for increasing, decreasing or holding the gain in response to the signals output from the first and second comparators.

Here, The gain amplifier of the receiving unit is a programmable gain amplifier. The power detector includes an input resistor part, a programmable gain amplifier, an envelope detector and an output resistor part. The programmable gain amplifier is controlled by a control signal from an I²C.

The output signal level detected by the power detector is divided into a safe zone, a warn zone and a saturation zone. The control signal from the I²C is converted by a digital-analog converter into a saturation voltage and a warn voltage. The saturation voltage, warn voltage and output voltage of the power detector are input to the second comparator, and the second comparator transmits a digital signal to the gain controller of the gain control unit in response to a 2-bit control signal to control the gain.

Here, the comparator outputs the 2-bit control signal having values '0' and '0' to the gain controller when the combination of the saturation voltage and the output voltage is larger than the output voltage but smaller than the warn voltage. The comparator outputs the 2-bit control signal having values '0' and '1' to the gain controller when the combination of the saturation voltage and the output voltage is larger than the output voltage and the warn voltage. The comparator outputs the 2-bit control signal having values '1' and '0' to the gain controller when the combination of the saturation voltage and the output voltage is smaller than the output voltage and the warn voltage. The comparator outputs the 2-bit control signal having values '1' and '1' to the gain controller when the combination of the saturation voltage and the output voltage is smaller than the output voltage but larger than the warn voltage. The 2-bit control signal having values '0' and '0' corresponds to the safe zone, the 2-bit control signal having values '0' and '1' or '1' and '0' corresponds to the warn zone, and the 2-bit control signal having values '1' and '1' corresponds to the saturation zone.

Here, the programmable gain amplifier has a gain range of −15 dB to 15 dB. The gain of the programmable gain amplifier is divided into 3 dB steps, and the number of control bits is 4.

The input resistor part has a resistance of larger than 1kΩ. The output resistor part is constructed of a resistor and a capacitor connected in parallel with each other.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
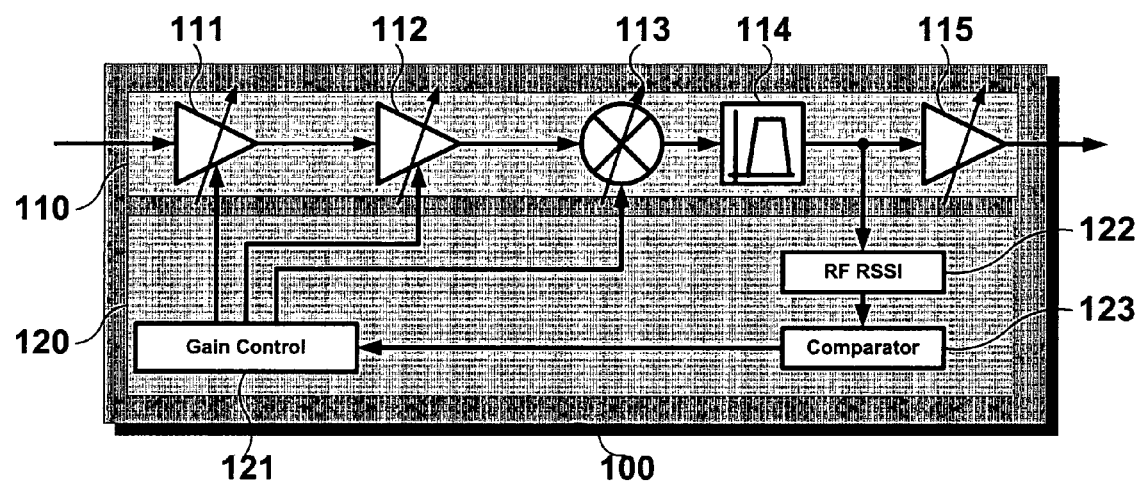
FIG. 1 is a block diagram of a conventional automatic gain control circuit including an RF received signal strength indicator.
Figure 2:
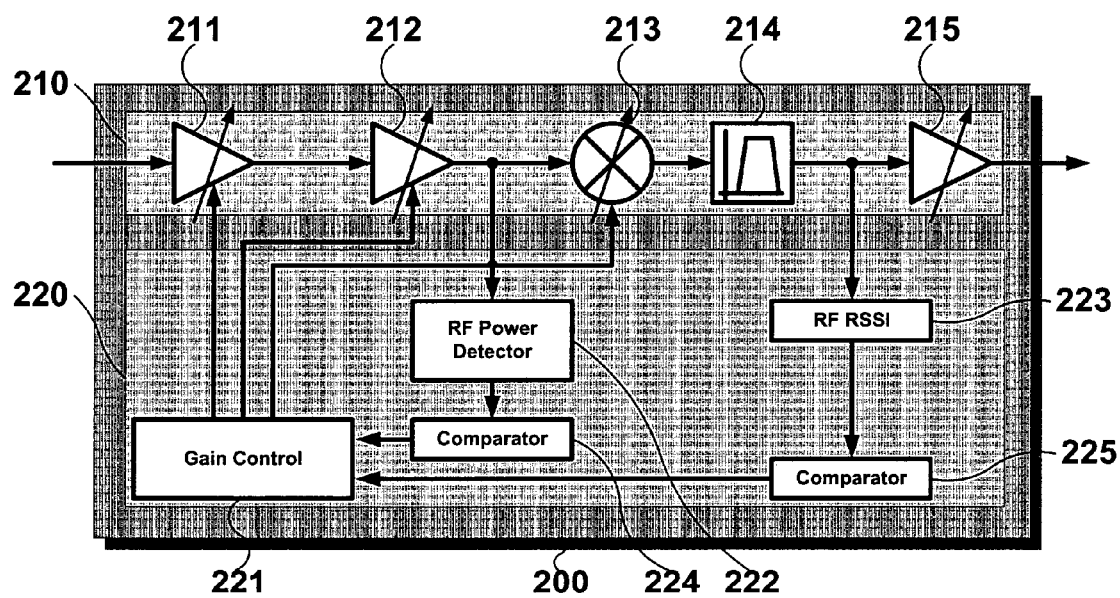
FIG. 2 is a block diagram of an automatic gain control circuit including a power detector according to an embodiment of the present invention.

FIG. 2 is a block diagram of an automatic gain control circuit 200 including a power detector according to an embodiment of the present invention. Referring to FIG. 2, the automatic gain control circuit 200 includes a receiving unit 210 and a gain control unit 220.

The receiving unit 210 includes a low noise amplifier (LNA) 211, an RF programmable gain amplifier (RF PGA) 212, an image-rejection mixer (IRM) 213, a low pass filter (LPF) 214, and an intermediate frequency variable gain amplifier (IF VGA) 215. The gain control unit 220 includes a gain controller 221, an RF power detector 222, comparators 224 and 225, and an RF received signal strength indicator (RF RSSI) 223.

The LNA 211 of the receiving unit 210 amplifies a received signal while restraining amplification of a noise of the received signal. The RF PGA 212 of the receiving unit 210 amplifies the signal amplified by the LNA 211 to a signal with improved linearity within a predetermined range.

The signal amplified by the RF PGA 212 passes through the IRM 213 having an image rejection down-conversion function such that an image frequency is rejected to remove parasitic frequencies. That is, the IRM 213 of the receiving unit separates an RF stage from an IF stage to secure stability of the receiving unit 210.

The LPF 214 of the receiving unit 210 is constructed such that it filters only a specific low band. The signal filtered by the LPF 214 is amplified by the IF VGA 215. Here, a small received signal cannot be sufficiently amplified only with the LNA 211 of the receiving unit 210. Thus, the small received signal is gain-controlled and amplified using the IF VGA 215 for accurate power control.

When the received signal passes through all the components of the receiving unit 210, it is amplified with its image frequency rejected and output as an intermediate frequency.

The gain controller 221 of the gain control unit 220 outputs control signals for respectively controlling the gains of the LNA 211, RF PGA 212 and IRM 213. The RF RSSI 223 of the gain control unit 220 measures the strength of the signal output from the LPF 214 of the receiving unit 210. The comparator 225 of the gain control unit 220 sends a gain compensation value based on the signal strength measured by the RF RSSI 223 to the gain controller 221.

Consequently, in the RF AGC loop, input signal power is detected from the output signal of the LPF. Thus, only the power of a desired channel is detected to control the gain of the gain stage of the RF AGC loop.

The RF power detector 222 of the gain control unit 220 copes with a variation in the gain of the RF gain stage using the output of the RF PGA 212 of the receiving unit and a reference value received from an inter IC ($I^2C$) bus, to thereby prevent the RF AGC loop from being erroneously operated.

The comparator 224 of the gain control unit 220 compares the level of the output signal of the RF power detector 222 with the level of the signal received from an $I^2C$ to output a signal for increasing, maintaining or decreasing the gain stage of the RF AGC loop and sends the signal to the gain controller 221.

Figure 3:
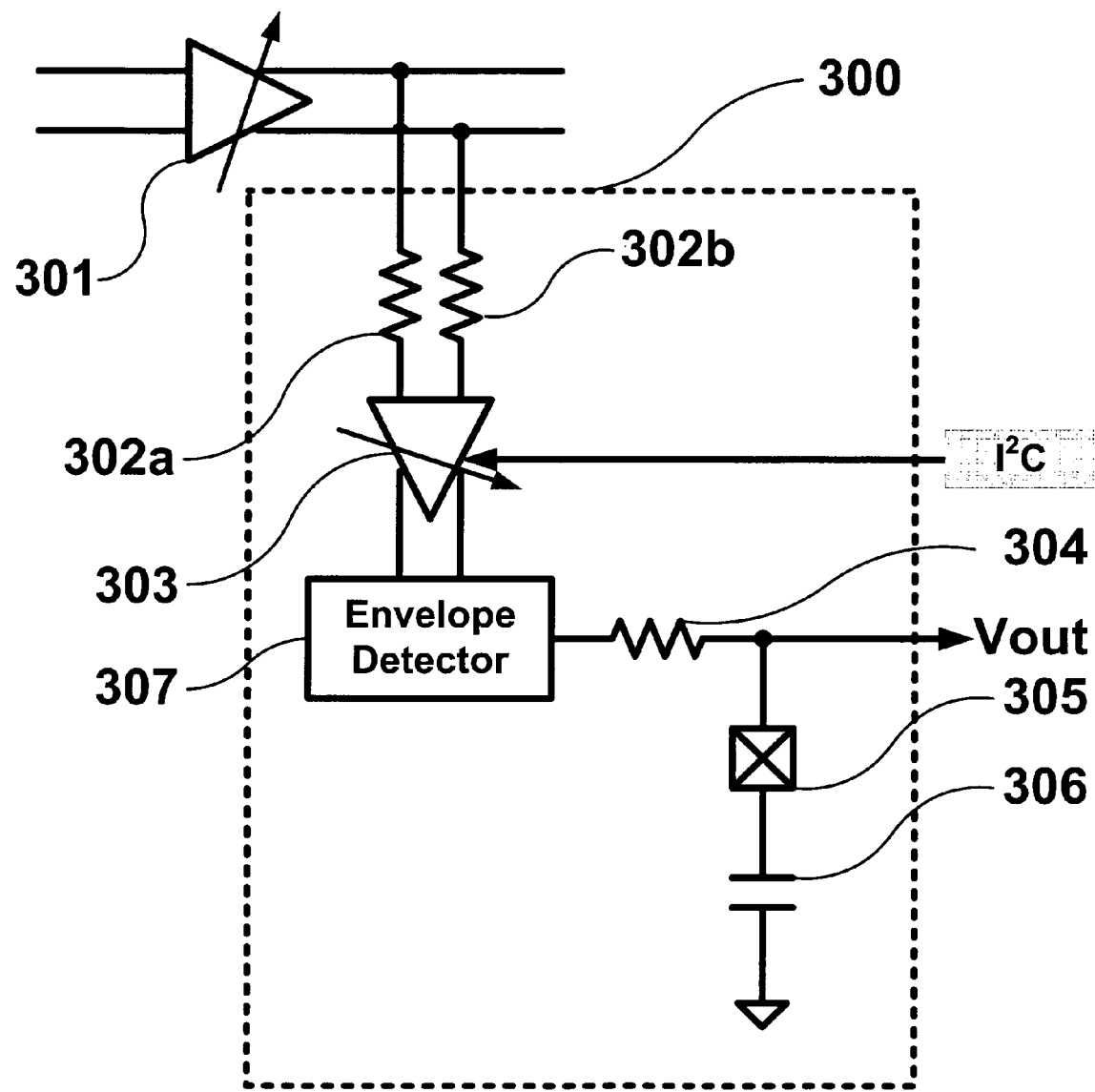
FIG. 3 is a circuit diagram of the power detector of the automatic gain control circuit according to the present invention.

FIG. 3 is a circuit diagram of the RF power detector 222 of the automatic gain control circuit according to the present invention. Referring to FIG. 3, the power detector 300 includes input resistors 302a and 302b, an RF PGA 303, an envelope detector 307, an output resistor 304, and a capacitor 305.

The input resistors 302a and 302b have a resistance of more than 1 kΩ such that a load is not applied to an RF PPGA 301. The RF PGA 303 amplifies a detected small signal based on a gain according to the $I^2C$ and applies the amplified signal to the envelope detector 307.

Here, RF PGA 303 has a gain range of −15 dB to 15 dB, which is controlled by a 4-bit control signal based on a 3 dB step.

The envelope detector 307 has a nonlinear detection form and is connected to the output resistor 304. The capacitor 306 is connected in parallel with the output resistor 304 to form an output stage and output an output voltage $V_{OUT}$.

Preferably, the RF power detector is constructed in different manners in response to VHF, UHF and L-band.

Figure 4:
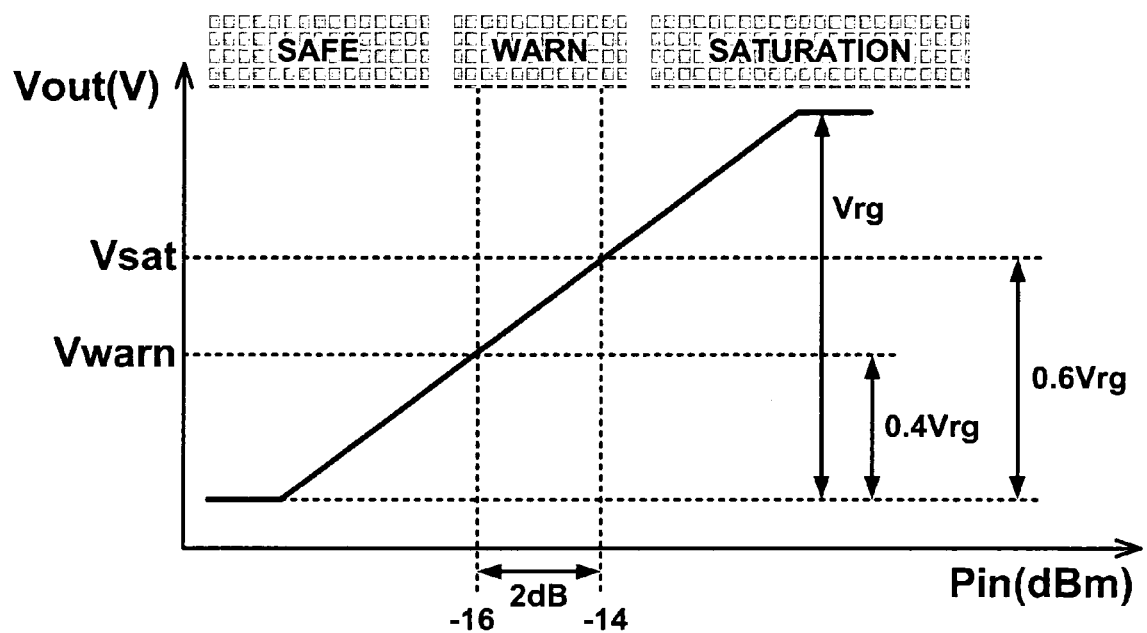
FIG. 4 shows the relationship between the output voltage and the input power of the RF power detector according to the present invention.

FIG. 4 is a graph showing the relationship between the output voltage and input power of the RF power detector. In the graph of FIG. 4, the horizontal axis represents the input power Pin of the power detector 300 that uses the output signal of the RF PGA 212 shown in FIG. 2 as an input signal and the vertical axis represents the output voltage $V_{OUT}$ of the power detector 300. The graph includes a safe zone, a warn zone and a saturation zone.

Here, it is assumed that 1 dB desensitization point corresponds to the point where power of disturbance signals is −14 dBm. The safe zone means a zone where the input power Pin is less than −16 dBm, and the warn zone corresponds to a zone where the input power Pin is in a range of −16 dBm to −14 dBm. In addition, the saturation zone means a zone where the input power Pin is more than −14 dBm.

That is, when the difference between the minimum value and maximum value of the output voltage is Vrg, the difference between the minimum value of the output voltage and a saturation voltage $V_{SAT}$ is 0.6 Vrg and the difference between the minimum value of the output voltage and a warn voltage $V_{WARN}$ is 0.4 Vrg.

The width of the warn zone is approximately 2 dB. The output voltage $V_{OUT}$ corresponding to input power −16 dBm is a voltage meeting the warn voltage $V_{WARN}$, and the output voltage $V_{OUT}$ corresponding to input power −14 dBm is a voltage meeting the saturation voltage $V_{SAT}$.

The RF circuit must be operated in the safe zone. However, in the case where 1 dB desensitization point corresponds to the point where power of disturbance signals such as noises is −14 dBm, the RF circuit has a problem in its operation when the power of disturbance signals is shifted to −13 dBm that is included in the saturation zone. Accordingly, the warn zone of approximately 2 dB is placed before the saturation zone such that RF gain is not increased any more when the power of disturbance signal approaches to the warn zone near −16 dBm.

To meet a variation in 1 dB desensitization point of the RF gain stage for the warn zone, the amplifier 303 having a gain range of −15 dB to 15 dB is placed at the input stage of the envelope detector 307.

Figure 5A:
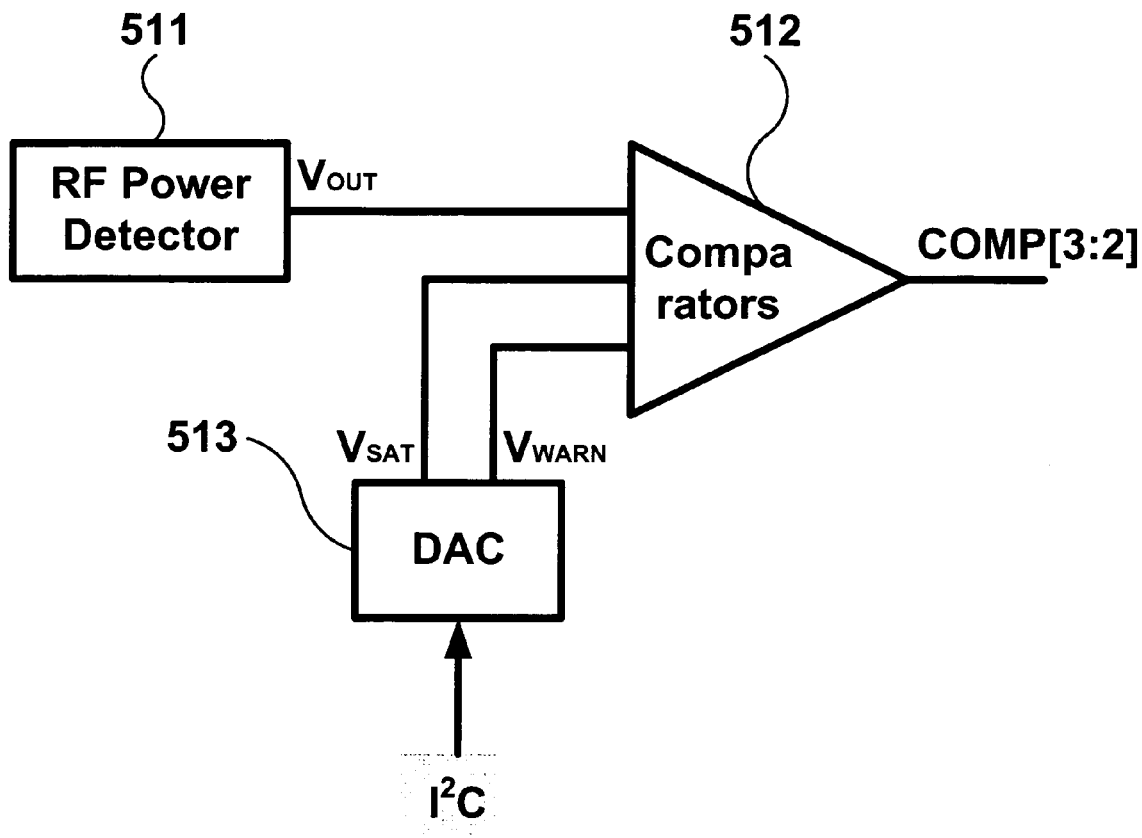
FIG. 5A shows the configuration of a gain compensation part of the RF power detector according to an embodiment of the present invention.

FIG. 5A shows the configuration of a gain compensation part of the RF power detector according to the present invention. Referring to FIG. 5A, the gain compensation part of the RF power detector includes an RF power detector 511, a comparator 512 and a digital-to-analog converter (DAC) 513.

The comparator 512 receives output signals $V_{SAT}$ and $V_{OUT}$ of the DAC 513, which are based on the output signal $V_{OUT}$ of the RF power detector 511 and data received from an I²C bus. The digital signal output from the comparator 512 is transmitted to the gain controller to carry out gain compensation control using the RF power detector 511 in response to a 2-bit control signal. The composition of the 2 control bits of the control signal of the gain compensation part of the RF power detector is shown in Table 1.

TABLE 1

| Condition | COMP[3] | COMP[2] | Counter |
| --- | --- | --- | --- |
| $V_{OUT} < V_{SAT} \& V_{OUT} < V_{WARN}$ | 0 | 0 | Safe |
| $V_{OUT} < V_{SAT} \& V_{OUT} > V_{WARN}$ | 0 | 1 | Warn |
| $V_{OUT} > V_{SAT} \& V_{OUT} < V_{WARN}$ | 1 | 0 | Warn |
| $V_{OUT} > V_{SAT} \& V_{OUT} > V_{WARN}$ | 1 | 1 | Saturation |

As shown in Table 1, a first control of the RF power detector compensation part corresponds to the case where the combination $V_{SAT} \& V_{OUT}$ of the output $V_{OUT}$ of the RF power detector 511 and the output $V_{SAT}$ of the DAC 513 is larger than the output $V_{OUT}$ of the RF power detector 511 but smaller than the output $V_{WARN}$ of the DAC 513. The value of the fourth control bit COMP[3] of a control bus is '0' and the value of the third control bit COMP[2] is also '0', which corresponds to the safe zone.

A second control of the RF power detector compensation part corresponds to the case where the combination $V_{SAT} \& V_{OUT}$ of the output $V_{OUT}$ of the RF power detector 511 and the output $V_{SAT}$ of the DAC 513 is larger than the output $V_{OUT}$ of the RF power detector 511 and the output $V_{WARN}$ of the DAC 513. The value of the fourth control bit COMP[3] of the control bus is '0' and the value of the third control bit COMP[2] is '1', which corresponds to the warn zone.

A third control of the RF power detector compensation part corresponds to the case where the combination $V_{SAT} \& V_{OUT}$ of the output $V_{OUT}$ of the RF power detector 511 and the output $V_{SAT}$ of the DAC 513 is smaller than the output $V_{OUT}$ of the RF power detector 511 and the output $V_{WARN}$ of the DAC 513. The value of the fourth control bit COMP[3] of a control bus is '1' and the value of the third control bit COMP[2] is '0', which corresponds to the warn zone.

A fourth control of the RF power detector compensation part corresponds to the case where the combination $V_{SAT} \& V_{OUT}$ of the output $V_{OUT}$ of the RF power detector 511 and the output $V_{SAT}$ of the DAC 513 is smaller than the output $V_{OUT}$ of the RF power detector 511 but larger than the output $V_{WARN}$ of the DAC 513. The value of the fourth control bit COMP[3] of a control bus is '1' and the value of the third control bit COMP[2] is also '1', which corresponds to the saturation zone.

Figure 5B:
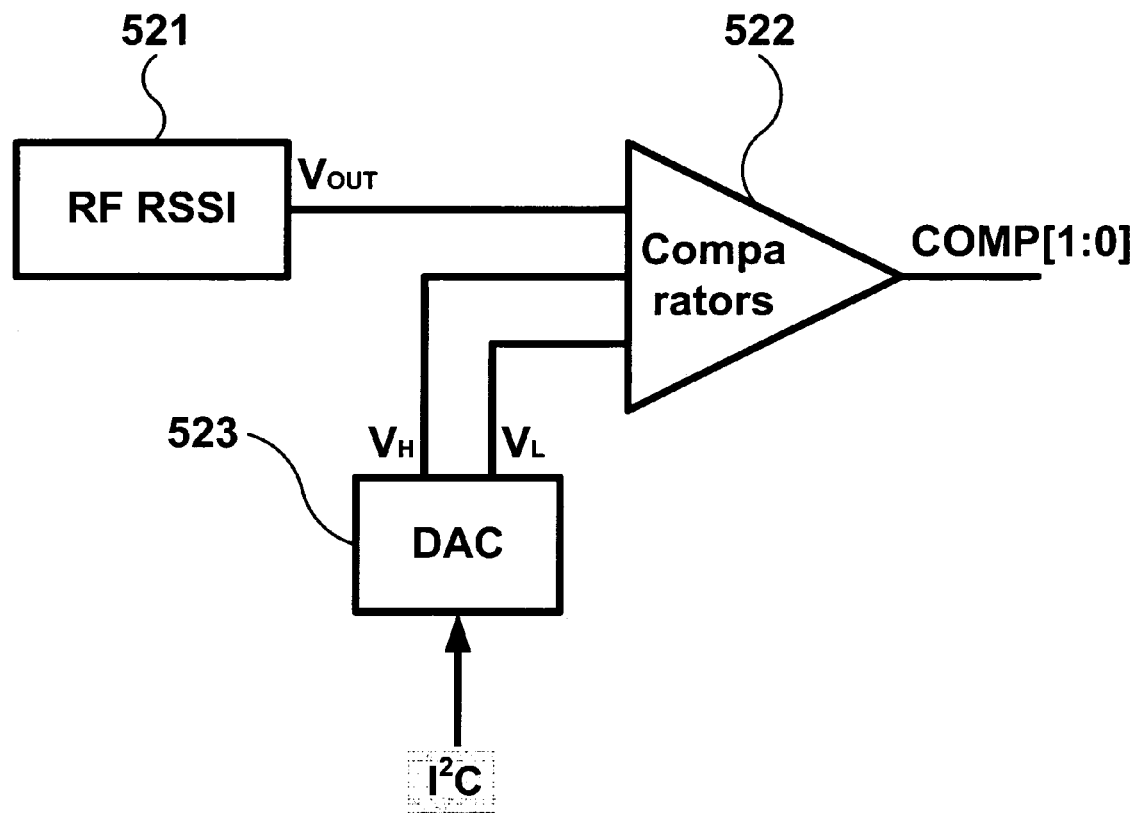
FIG. 5B shows the configuration of an RF RSSI control part according to an embodiment of the present invention.

FIG. 5B shows the configuration of an RF RSSI control part according to an embodiment of the present invention. Referring to FIG. 5B, the RF RSSI control circuit includes an RF RSSI 521, a comparator 522, and a DAC 523.

The comparator 522 receives output signals $V_H$ and $V_L$ of the DAC 523, which are based on the output signal $V_{OUT}$ of the RF RSSI 521 and data received from an I²C bus. The digital signal output from the comparator 522 is transmitted to the gain controller to carry out gain compensation control using the RF RSSI 521 in response to a 2-bit control signal. The composition of the 2 control bits of the control signal of the RF RSSI control part is shown in Table 2.

TABLE 2

| Condition | COMP[1] | COMP[0] | Counter |
| --- | --- | --- | --- |
| $V_{OUT} > V_L \& V_{OUT} > V_H$ | 0 | 0 | Decrease(−) |
| $V_{OUT} > V_L \& V_{OUT} < V_H$ | 0 | 1 | Hold |
| $V_{OUT} < V_L \& V_{OUT} > V_H$ | 1 | 0 | Hold |
| $V_{OUT} < V_L \& V_{OUT} < V_H$ | 1 | 1 | Increase(+) |

As shown in Table 2, a first control of the RF RSSI control part corresponds to the case where the combination $V_L \& V_{OUT}$ of the output $V_{OUT}$ of the RF RSSI 521 and the output $V_L$ of the DAC 523 is smaller than the output $V_{OUT}$ of the RF RSSI 521 but larger than the output $V_H$ of the DAC 523. The value of the second control bit COMP[1] of a control bus is '0' and the value of the first control bit COMP[0] is also '0', which corresponds to a decrease state.

A second control of the RF RSSI control part corresponds to the case where the combination $V_L \& V_{OUT}$ of the output $V_{OUT}$ of the RF RSSI 521 and the output $V_L$ of the DAC 523 is smaller than the output $V_{OUT}$ of the RF RSSI 521 and the output $V_H$ of the DAC 523. The value of the second control bit COMP[1] of a control bus is '0' and the value of the first control bit COMP[0] is '1', which corresponds to a hold state.

A third control of the RF RSSI control part corresponds to the case where the combination $V_L \& V_{OUT}$ of the output $V_{OUT}$ of the RF RSSI 521 and the output $V_L$ of the DAC 523 is larger than the output $V_{OUT}$ of the RF RSSI 521 and the output $V_H$ of the DAC 523. The value of the second control bit COMP[1] of a control bus is '1' and the value of the first control bit COMP[0] is '0', which corresponds to the hold state.

A fourth first control of the RF RSSI control part corresponds to the case where the combination $V_L \& V_{OUT}$ of the output $V_{OUT}$ of the RF RSSI 521 and the output $V_L$ of the DAC 523 is larger than the output $V_{OUT}$ of the RF RSSI 521 but smaller than the output $V_H$ of the DAC 523. The value of the second control bit COMP[1] of a control bus is '1' and the value of the first control bit COMP[0] is also '1', which corresponds to an increase state.

Tables 1 and 2 are arranged as follows.

TABLE 3

| RF Power Detector | Safe | | | Warn | | | Saturation | | |
|---|---|---|---|---|---|---|---|---|---|
| RF RSSI | U | D | S | U | D | S | U | D | S |
| RF PGA  | U | D | S | S | D | S | D | D | D |

In Table 3, U means up, D means down, and S means stay.

That is, the comparator judges the output signal of the RF RSSI and divides it into decrease, hold and increase zones. Furthermore, the comparator judges the output signal of the RF power detector and divides it into safe, ward and saturation zones. From the zones of the RF RSSI and RF power detector, it is determined whether RF gain will be increased, held or decreased to transmit a corresponding control signal to the gain controller.

That is, the comparators 224 and 225 compare information received from the I²C with information detected by the RF RSSI and RF power detector and provide controls signals to the gain controller such that the RF circuit is operated in the safe zone. This secures stable operation of the circuit.

The present invention can control the gain of the RF automatic gain control loop using the power detector to prevent the RF automatic gain control loop from being erroneously operated due to an undesirable large signal included in received signals. Furthermore, the present invention can reduce the gain of the RF AGC loop to receive a desired channel signal even when a neighboring channel signal larger than the desired signal is received.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An automatic gain control circuit including a receiving unit for receiving an RF signal and a gain amplifier for controlling the gain of the receiving unit,
   wherein the receiving unit comprises an amplification part including a low noise amplifier and a gain amplifier configured to amplify the RF signal, a mixer configured to down-convert and tune the RF signal output from the gain amplifier, a low pass filter configured to receive the down-converted signal from the mixer, and an intermediate frequency variable gain amplifier configured to amplify the signal filtered by the low pass filter to an intermediate frequency signal, and;
   wherein the gain control unit comprises a received signal strength indicator connected to the output port of the low pass filter and configured to detect the level of the output signal of the low pass filter, a first comparator configured to compare the output signal level detected by the received signal strength indicator with a first reference signal level, a power detector configured to detect the output signal level of the amplification part of the receiving unit, a second comparator configured to compare the output signal level detected by the power detector with a second reference signal level, and a gain controller-configured to increase, decrease or hold the gain in response to the signals output from the first and second comparators,
   wherein the power detector includes an input resistor part, a programmable gain amplifier, an envelope detector and an output resistor part.

2. The automatic gain control circuit as claimed in claim 1, wherein the programmable gain amplifier is controlled by a control signal from an I²C.

3. The automatic gain control circuit as claimed in claim 2, wherein the output signal level detected by the power detector is divided into a safe zone, a warn zone and a saturation zone, the control signal from the I²C is converted by a digital-analog converter into a saturation voltage and a warn voltage, the saturation voltage, warn voltage and output voltage of the power detector are input to the second comparator, and the second comparator transmits a digital signal to the gain controller of the gain control unit in response to a 2-bit control signal to control the gain.

4. The automatic gain control circuit as claimed in claim 3, wherein the comparator outputs the 2-bit control signal having values '0' and '0' to the gain controller when the combination of the saturation voltage and the output voltage is larger than the output voltage but smaller than the warn voltage;
   the comparator outputs the 2-bit control signal having values '0' and '1' to the gain controller when the combination of the saturation voltage and the output voltage is larger than the output voltage and the warn voltage;
   the comparator outputs the 2-bit control signal having values '1' and '0' to the gain controller when the combination of the saturation voltage and the output voltage is smaller than the output voltage and the warn voltage; and
   the comparator outputs the 2-bit control signal having values '1' and '1' to the gain controller when the combination of the saturation voltage and the output voltage is smaller than the output voltage but larger than the warn voltage, the 2-bit control signal having values '0' and '0' corresponds to the safe zone, the 2-bit control signal having values '0' and '1' or '1' and '0' corresponds to the warn zone,
   and the 2-bit control signal having values '1' and '1' corresponds to the saturation zone.

5. The automatic gain control circuit as claimed in claim 1, wherein the programmable gain amplifier has a gain range of −15 dB to 15 dB.

6. The automatic gain control circuit as claimed in claim 5, wherein the gain of the programmable gain amplifier is divided into 3 dB steps, and the number of control bits is 4.

7. The automatic gain control circuit as claimed in claim 1, wherein the input resistor part has a resistance of larger than 1 kΩ.

8. The automatic gain control circuit as claimed in claim 7, wherein the output resistor part is constructed of a resistor and a capacitor connected in parallel with each other.

* * * * *